United States Patent

Inoi et al.

[11] Patent Number: 6,008,565
[45] Date of Patent: Dec. 28, 1999

[54] LAMINATED PIEZOELECTRIC TRANSFORMER

[75] Inventors: Takayuki Inoi; Takesi Inoue, both of Tokyo, Japan

[73] Assignee: NEC Corporation, Tokyo, Japan

[21] Appl. No.: 09/062,584

[22] Filed: Apr. 20, 1998

[30] Foreign Application Priority Data

Apr. 18, 1997 [JP] Japan .................................. 9-116472

[51] Int. Cl.⁶ .................................................. H01L 41/04
[52] U.S. Cl. ........................................... 310/366; 310/359
[58] Field of Search ...................................... 310/359, 366

[56] References Cited

U.S. PATENT DOCUMENTS

| | | | |
|---|---|---|---|
| 2,830,274 | 4/1958 | Rosen et al. | 310/358 |
| 5,118,982 | 6/1992 | Inoue et al. | 310/366 |
| 5,241,236 | 8/1993 | Sasaki et al. | 310/358 |
| 5,402,031 | 3/1995 | Tagami et al. | 310/359 |
| 5,463,266 | 10/1995 | Fukuoka et al. | 310/359 |
| 5,777,425 | 7/1998 | Ino et al. | 310/359 |

FOREIGN PATENT DOCUMENTS

| | | |
|---|---|---|
| 0 854 564 A2 | 7/1998 | European Pat. Off. . |
| 5-235432 | 9/1993 | Japan . |
| 6-177451 | 6/1994 | Japan . |
| 6-224484 | 8/1994 | Japan . |
| 8-153914 | 6/1996 | Japan . |

*Primary Examiner*—Nestor Ramirez
*Assistant Examiner*—Peter Medley
*Attorney, Agent, or Firm*—Sughrue, Mion, Zinn, Macpeak & Seas, PLLC

[57] ABSTRACT

A laminated step-down piezoelectric transformer has a driving portion 11 and an electric power generating portion 12 disposed on both end portions of an elongated plate. These portions are formed by alternately laminating piezoelectric members 111 and internal electrodes 112 . . . interposed by an insulating portion respectively. The piezoelectric members 111 of the driving portion 11 are thicker in thickness than that of the electrical power generating portion 12. The transformer is driven with a second-order mode in the longitudinal direction so that the transformer has a high transformation efficiency. Impedance matching can be realized easily. The piezoelectric transformer is safe in operation by separating the input and the output from each other.

13 Claims, 6 Drawing Sheets

LAMINATED PIEZOELECTRIC TRANSFORMER

TECHNICAL FIELD OF THE INVENTION

This invention relates to a transformer used as a variety of dc sources. More particularly, it relates to laminated step-down type piezoelectric transformers employed with advantage for a small-sized rectifying power source requiring reduced size and weight, and high in reliability.

RELATED ART

Up to now, as a so-called ac adapter step-down transformer, for supplying the power from a commercial power source line to a variety of battery-driven electronic equipment, wire-wound electro-magnetic transformers have been used. The electromagnetic transformer has a structure in which a conductor is placed around a core of a magnetic material, such that considerable difficulties are encountered in realizing a small-sized lightweight electro-magnetic transformer.

On the other hand, a piezoelectric transformer, having an operating principle totally different from that of an electro-magnetic transformer, has been proposed in U.S. Pat. No. 2,830,274 issued to A. Rosen in 1958. FIG. 2 shows a basic structure of the proposed structure in which the piezoelectric transformer is driven in a λ/2 mode.

Referring to FIG. 2, a portion of a piezoelectric member 201 having planar-shaped electrodes 202, 203 on its upper and lower surfaces provides a driving part 21 which is polarized in the direction of thickness. Another portion of the piezoelectric member 201 sandwiched between the driving part 21 and an end electrode 204 provided on an end face of the piezoelectric member 201 is an electric power generating part 22 which is polarized in the direction along the length.

With this piezoelectric transformer, a supporting fixture 205 is disposed at a node of resonant longitudinal vibration along its length so as to be thereby secured to a support, not shown. If, in the state, an ac voltage having the resonant frequency of the longitudinal vibration of the piezoelectric member 201 is applied across external electrical terminals 206, 207 connected to the planar-shaped electrodes 202, 203, an electrical voltage is generated across an external electrical terminal 207 and another external terminal 208 connected to the end electrode 204.

The piezoelectric transformer shown in FIG. 2 suffers from a drawback that it is poor in efficiency and reliability because the connecting positions of the driving part and the electric power generating part are not disposed at the node of vibration. Moreover, the step-up ratio cannot be increased sufficiently because the piezoelectric transformer is made up of a sole plate-like member.

As a prior-art technique, contemplated to improve the above-mentioned problems, there is known a laminated piezoelectric transformer proposed in, for example, the JP Patent Kokai JP-A-6-224484. FIG. 3 shows a cross-sectional view of this prior-art laminated piezoelectric transformer. This laminated piezoelectric transformer is driven at a driving frequency in a triple mode of λ/2.

Referring to FIG. 3, the part of a rectangular-shaped piezoelectric plate 310 indicated by 31 is a low-impedance driving portion comprised of plural sets each made up of laminated planar-inner electrodes 311, 312 and a piezoelectric member 313. On the upper and lower surfaces of the piezoelectric plate 310 are mounted planar-shaped electrodes 314, 315. An external electrode, not shown, is formed on a lateral surface of the piezoelectric plate 310 for connection to the inner electrodes. These components are polarized in a direction along the thickness of the piezoelectric member 313.

The portion of the piezoelectric plate 310 indicated by 32 is a high-impedance electric power generating portion comprised of plural layers of strip-shaped internal electrodes 317 and piezoelectric members 313, alternately laminated together. On the upper and lower surfaces of the piezoelectric plate 310 are provided strip-shaped electrodes 318, 319. An external electrode, not shown, is formed on a lateral surface of the piezoelectric plate 310 for connection to the inner electrodes.

The electric power generating part is polarized in a direction along the length. With this piezoelectric transformer, since the external electrical terminals 321, 322 and 323 can be connected at nodes of the longitudinal vibration, there is no risk lowering of the efficiency or reliability, while a large step-up ratio can be realized because of the laminated structure.

Meanwhile, the above-mentioned piezoelectric transformers are of the step-up type. If the inputs and the outputs of the known transformers are reversed so that the transformers will operate as step-down transformers, the resulting transformers are not practically useful because of problems in connection with impedance matching and transformation efficiency.

As step-down piezoelectric transformers, there are known those proposed in JP Patents Kokai JP-A-8-153914, 6-177451 and 5-235432.

FIG. 4 shows a structure of a step-down piezoelectric transformer proposed in the above-referenced JP-A-8-153914. In FIG. 4, a portion indicated by 41 is a driving part made up of internal electrodes 401, 402 and piezoelectric members 403, alternately laminated together. The internal electrodes are connected electrically via external electric terminals. These internal electrodes are polarized in a direction along the thickness.

A portion indicated by 42 is an electric power generating portion comprised of internal electrodes 406, 407 and piezoelectric members 408, alternately laminated together. With this piezoelectric transformer, the electric power generating portion is excited into longitudinal vibration, in unison with the longitudinal vibration of the driving portion, to generate the stopped-down voltage. An ac voltage of the first-order resonant frequency is applied in the longitudinal direction of the driving portion 41 for generating a stepped-down electrical voltage in the electric power generating portion 42 via external velectnical terminals.

FIG. 5 shows a structure of a step-down piezoelectric transformer proposed in the above-referenced JP-A-6-177451. In FIG. 5, a portion indicated by 51 is an electric power generating portion having planar-shaped electrodes 501, 502 on upper and lower surfaces in the longitudinal direction. The electric power generating portion 51 is polarized in a direction along the thickness. Another portion indicated by 52 is a driving portion having an input electrode 503 on a lateral surface in the longitudinal direction, and the driving portion is polarized in the direction of width between the planar-shaped electrodes 501, 502 of the driving part. This piezoelectric transformer exploits the transverse effect of the longitudinal vibration. Specifically, an ac voltage of the first-order resonant frequency in the longitudinal direction is applied via external electrical terminals 504, 505 for generating a stepped-down voltage in the lactic power generating portion 51 via external electrical terminals 505, 506.

FIG. 6 shows a structure of a step-down piezoelectric transformer proposed in the above-mentioned JP-A-5-235432. In FIG. 6, portions indicated by 61 are driving parts, each comprised of internal electrodes 601, 602 and piezoelectric members 603, laminated together, with the internal electrodes being electrically connected via an external electrical terminal, not shown. These components are polarized in the direction of thickness.

Another portion indicated by 62 is an electrical power generating portion comprised of internal electrodes 606, 607 and piezoelectric members 608 alternately laminated together. These components similarly are polarized in the direction of thickness. With the present piezoelectric transformer, the electrical power generating portion is excited into vibration in the direction of thickness of the electrical power generating portion, in association with the longitudinal vibration in the direction of thickness of the driving portion, for generating the stepped-down electrical voltage. An ac voltage of the third-order resonant frequency in the direction of thickness is applied across the driving portion 61 via external electrical terminals for generating a stepped-down voltage in the electrical power generating portion 62 via external electrical terminals.

SUMMARY OF THE DISCLOSURE

However, it has turned out in the course of eager investigations toward the present invention that the above-described prior-art techniques suffer from the following problems.

(1) As a first problem, the conventional Rosen type piezoelectric transformer (U.S. Pat. No. 2,830,274) and the piezoelectric transformer proposed in the above-mentioned JP-A-6-224484 are of the step-up type. Although these transformers might be operated as the step-down type, as a principle, on reversing the input and the output. However, this step-down type transformer cannot be used practically because of problems in impedance matching and transformation efficiency.

(2) Among the step-down piezoelectric transformers, the piezoelectric transformer proposed in the above-mentioned JPA-8-153914 is explained for illustrating the second problem of the prior-art technique. This transformer generates a vibration in the longitudinal direction of the electrical power generating portion, in association with vibrations in the longitudinal direction of the driving portion, by taking advantage of the first-order vibration mode in the longitudinal direction. Thus, it is difficult to hold the piezoelectric transformer at the nodal point of the vibrations, such that the transformation efficiency cannot be improved sufficiently.

(3) The piezoelectric transformer proposed in the above-mentioned JP-A-6-177451 is explained in connection with the third problem of the prior-art technique. This transformer, exploiting the transverse effects of the longitudinal vibration, is of a single plate type and has the input and the output grounded in common. This renders it difficult to realize variations in the impedance matching with respect to the load. In addition, there is raised a safety problem because the input and the output are grounded in common.

(4) The piezoelectric transformer proposed in the above-mentioned JP-A-5-235432 is explained in connection with the fourth problem of the prior-art technique. This piezoelectric transformer, exploiting the longitudinal vibration in the direction of thickness, has a driving frequency as high as 2.4 MHz, thus raising problems in connection with the driving circuit rendering it difficult put the transformer into practical use.

Accordingly, the present invention generally aims at overcoming the above-mentioned problems of the prior art.

Specifically, it is an object of the present invention to provide a laminated (particularly, step-down) piezoelectric transformer in which the transformer is held at a nodal point for sufficiently increasing the transformation efficiency.

It is a further object of the present invention to provide a piezoelectric transformer having, a facilitated impedance matching in the laminated plural layer structure.

It is a still further object to provide a piezoelectric transformer having a driving portion isolated from the electrical power generating portion for assuring safety.

Still further objects will become apparent in the entire disclosure.

For accomplishing the above object, the present invention provides, in one aspect, a laminated type piezoelectric transformer having at each longitudinal end portion of the transformer in the shape of an elongated plate, a driving portion and an electrical power generating portion, respectively. Each of these is made up of plural sets of layers each having a piezoelectric member and an internal electrode. The transformer further comprises an insulate in by portion which insulates between the driving portion and the electrical power generating portion. In the transformer, the sole-layer thickness of the piezoelectric member of the driving portion is different from a sole-layer thickness of the electrical power generating portion. Particularly, each layer of the piezoelectric member of the driving portion is thicker than that of the electrical power generating portion.

The present invention also provides, in another aspect, a laminated type piezoelectric transformer defined above, wherein the driving portion and the electrical power generating portion are arranged separated from each other by a distance equal to half the mechanical resonance wavelength of the longitudinal vibrations $\lambda/2$ along the length of the piezoelectric transformer in the shape of the elongated plate (basic wavelength ($\lambda/2$), hereinafter). The transformer is driven at a double oscillation mode of the wavelength $\lambda/2$ (full wave resonant oscillation).

EMBODIMENTS OF THE INVENTION

Preferred embodiments of the present invention will be explained in detail. In a preferred embodiment of the present invention, the laminated type piezoelectric transformer has a driving portion, an electrical power generating portion and an insulating portion. The transformer has on both end portion, respectively along the length of the transformer in the shape of an contacted plate, the driving portion (11 in FIG. 1) and the electrical power generating portion (12 in FIG. 1) each made up of plural sets of layers, each set having a layer of a piezoelectric member and a layer of an internal electrode. An insulating portion (13 in FIG. 1) is provided between said driving portion and the electrical power generating portion. In the transformer, the layer thickness of the sole layer of the piezoelectric member of the driving portion (11 of FIG. 1) is thicker than the layer thickness of a sole layer of the electrical power generating portion.

In a preferred embodiment of the present invention, the driving portion and the electrical power generating portion are separated from each other by a distance equal to λ/2 of the mechanical resonance wavelength (λ) of the longitudinal vibration along the length of the piezoelectric transformer in the shape of the elongated plate.

Turning to the operation of the embodiments of the present invention, both end portions of the piezoelectric transformer in the form of an elongate plate are arranged as the driving portion and as the electrical power generating portion, each made up of laminated plural layers of internal electrode and the piezoelectric members. An insulating member is arranged at a boundary between the driving portion and the electrical power generating portion and the transformer is adapted for being driven in the second-order mode in the longitudinal direction. By modifying the laminated structure, the impedance may be decreased in accordance with the load impedance. Since the driving portion and the electrical power generating portion are insulated from each other, there is no problem raised in safety. The piezoelectric transformer is held at a nodal point of vibration, thus assuring an improved transformation efficiency.

EXAMPLES

For detailed illustration of the above-described embodiments of the present invention, preferred embodiments of the present invention will be explained in detail with reference to the drawings.

Figure 1:
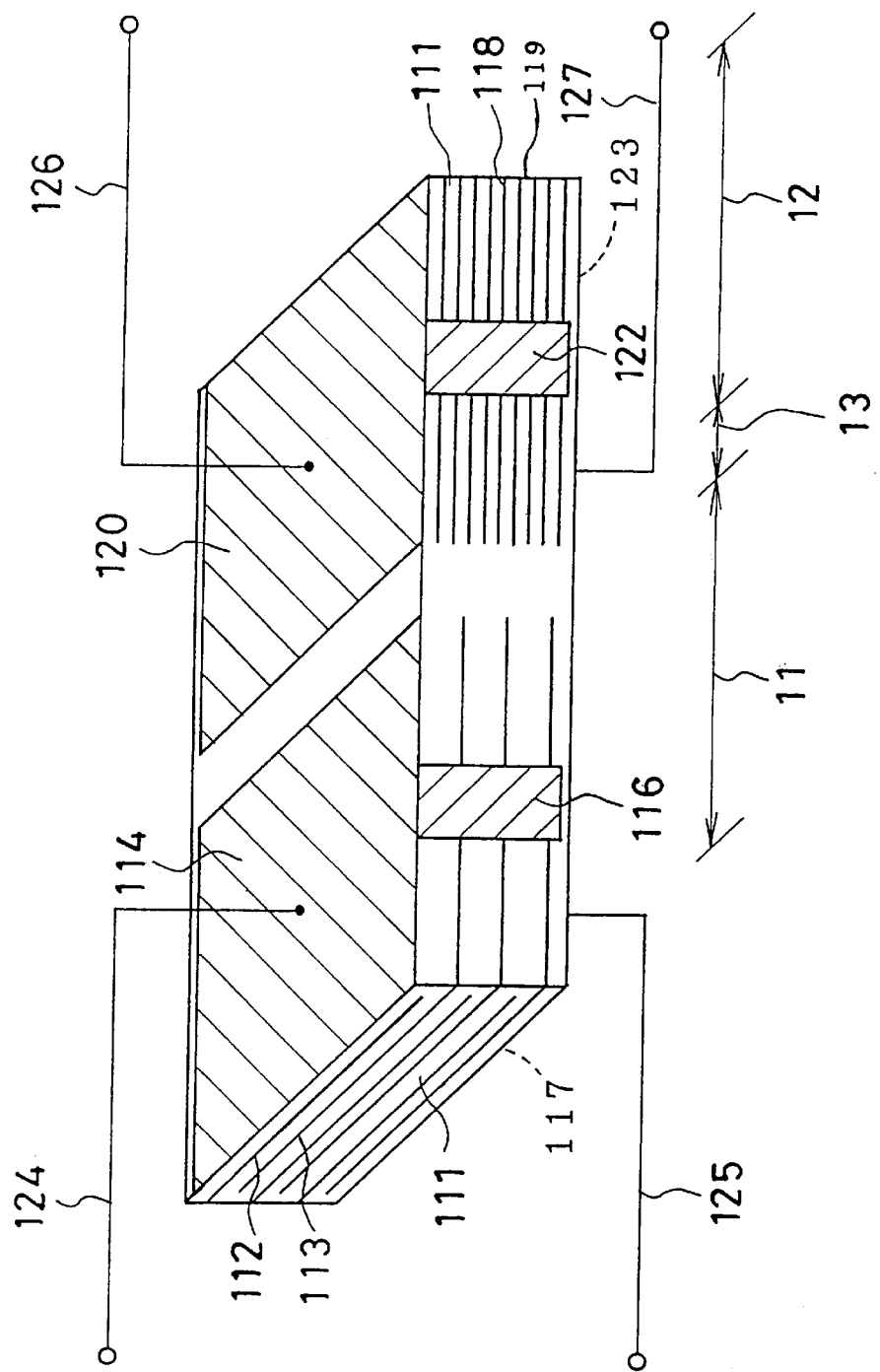
FIG. 1 is a perspective view showing the structure of a laminated piezoelectric transformer embodying the present invention.
Figure 2:
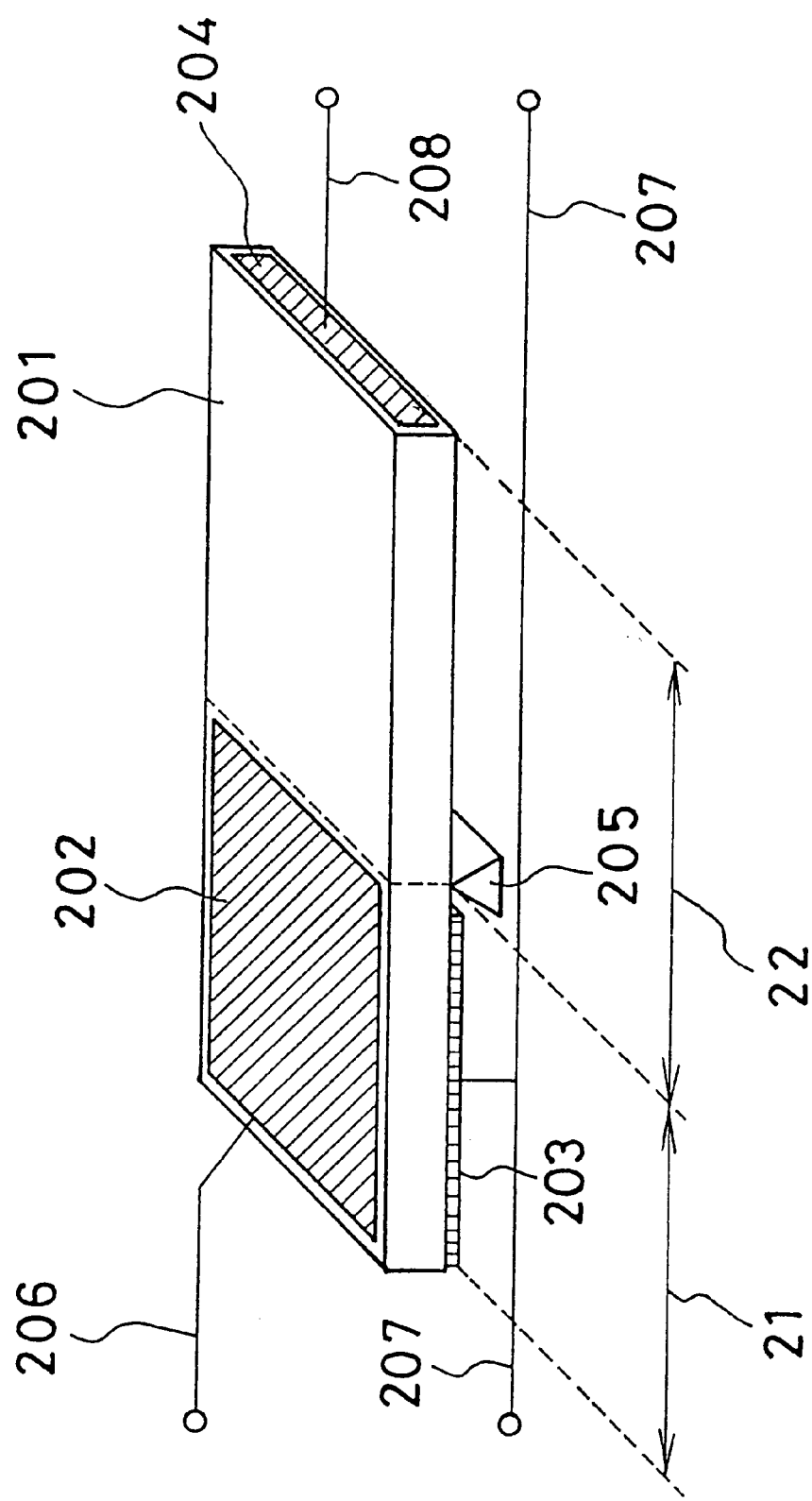
FIG. 2 is a perspective view showing a structure of a conventional single-plate type piezoelectric transformer.
Figure 3:
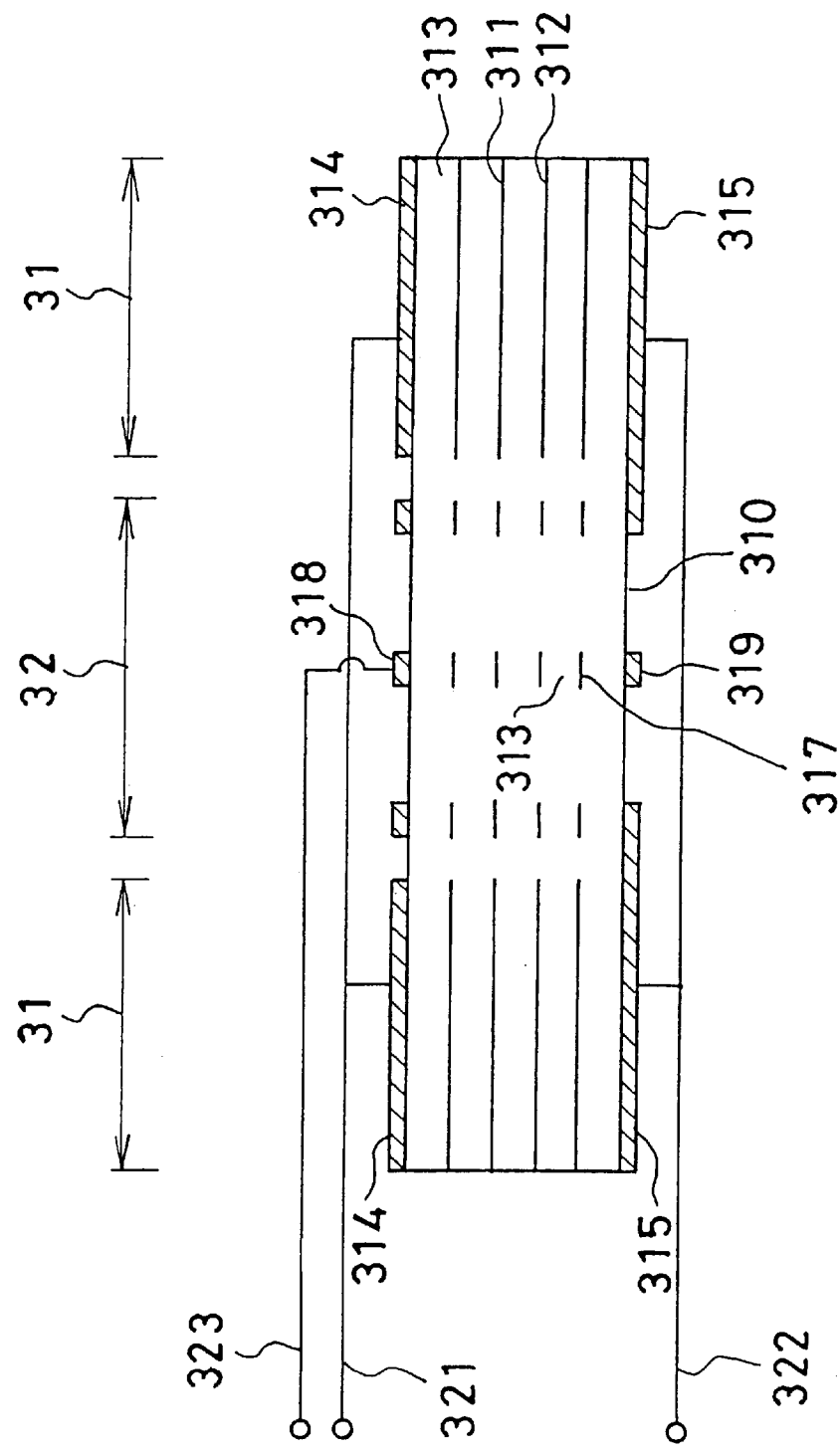
FIG. 3 is a cross-sectional view showing a structure of a conventional laminated type piezoelectric transformer.
Figure 4:
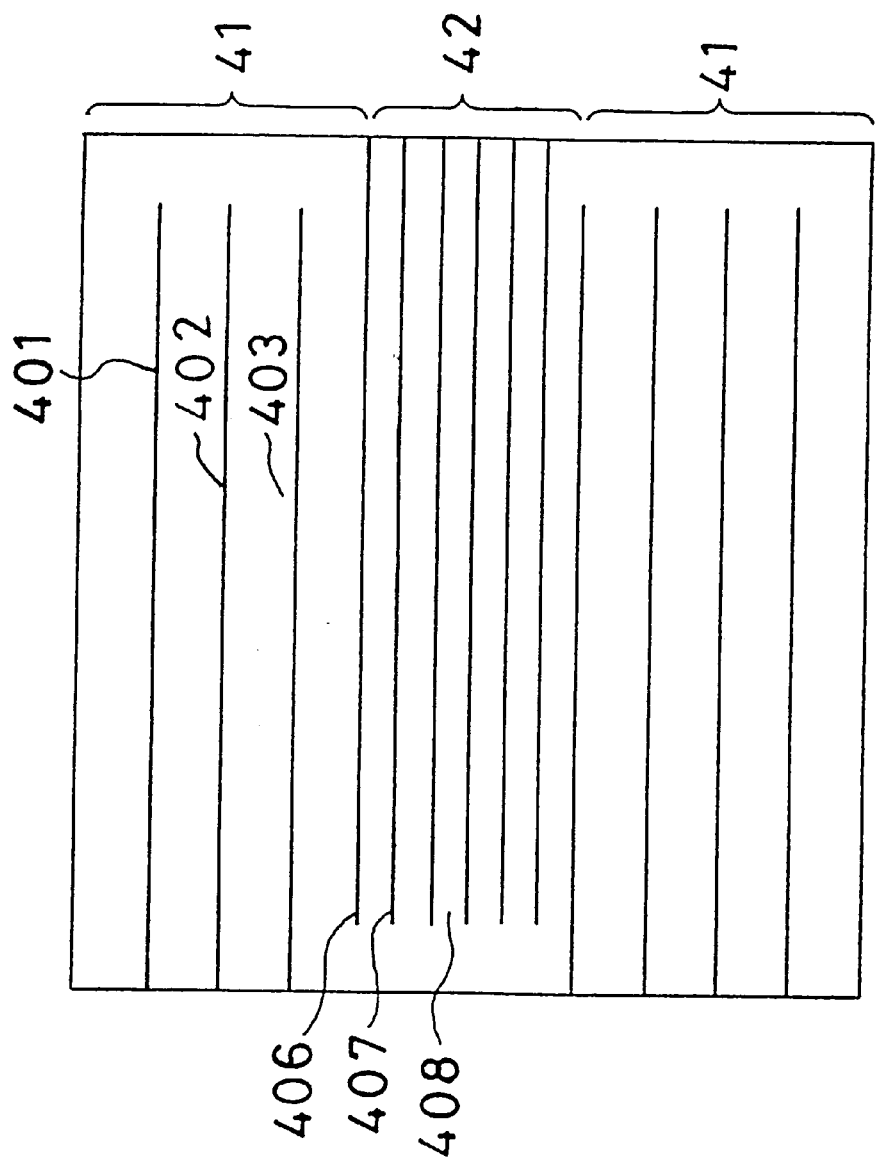
FIG. 4 is a cross-sectional view showing a conventional step-down piezoelectric transformer.

FIG. 1 is a perspective view showing the structure of a first embodiment of the present invention. Referring to FIG. 1, 11 denotes a high-impedance driving portion of a piezoelectric transformer comprised of a piezoelectric member 111 and internal electrodes 112, 113 alternately laminated together. On the upper and lower surfaces of the driving portion are formed external electrodes, 114, 117 of which only the upper surface side external electrode is shown and indicated by 114, with the opposite lower surface side external electrode 117 being not shown.

An extension of the external electrode 116, provided on a lateral surface, and another external electrode, not shown, provided on the opposite lateral surface, are external electrode extensions for electrically connecting the internal electrodes 112 or 113, respectively, alternately exposed on the opposite lateral sides. These electrode are polarized in the direction of thickness.

The portion indicated by 12 is an low-impedance electrical power generating portion comprised of plural sets of layers, each set being composed of a layer of piezoelectric member 111 and a layer of internal electrode 118, 119, and external electrodes arranged on upper and lower surfaces 120, 123. Of these external electrodes, only the electrode 120 on the upper surface is shown, while the external electrode provided on the lower, surface 123 is not shown.

An extension of external electrode 122 provided oil a lateral surface and another extension of external electrode, not shown, provided on the opposite lateral surface, are external electrode extensions for electrically connecting the internal electrodes 118 or 119, respectively, alternately exposed on the opposite lateral sides. These electrodes are polarized in the direction of thickness.

An insulating layer 13 is formed between the driving portion 11 and an electrical power generating portion 12 along the thickness of the transformer.

When an ac voltage is applied across external electrical terminals 124, 125 connected to the electrodes of the driving portion 11 for driving the piezoelectric transformer, an electrical voltage is produced across external electrical terminals 126 and 127 connected to the electrodes of the electrical power generating portion 12.

The method for manufacturing the piezoelectric transformer of the present embodiment is hereinafter explained.

In the present embodiment, a piezoelectric transformer configured as shown in FIG. 1 was fabricated by a green sheet method. The piezoelectric member 111 was formed of Nepec8 manufactured by TOKIN Co.

A green sheet of piezoelectric member 111 was first prepared. Internal electrodes 112, 113, 118 and 119 were prepared by screen-printing thereon using a baking type Ag/Pd paste (with an Ag/Pd ratio by weight being 70/30) on the green sheet of the piezoelectric member 111 to a pre-set pattern followed by lamination. The laminate was subjected to firing as one body with the piezoelectric member layers 111 with a keeping time duration of two hours at a temperature of 1200° C.

In the present embodiment, PZT-based piezoelectric ceramics and a Ag/Pd paste were used as materials for the piezoelectric member and the internal electrodes. It is to be noted however that any other combinations of materials for the piezoelectric transformer comprised of piezoelectric materials and an electrode material that can be used for sintering as one solid body can be employed satisfactorily.

As for the laminated structure, the driving portion 11 is invade up of 7 layers of the piezoelectric member layers and 6 layers of the internal electrode layers, with a thickness between the neighboring internal electrodes being 285 μm, whilst the electrical power generating portion 12 is made up of 35 layers of the piezoelectric member layers and 34 layers of the internal electrode layers, with a thickness between the neighboring internal electrodes being 57 μm.

The sintered assembly was machined to a length of 48 mm, a width of 15 mm and a thickness of 2 mm. A baking type Ag/Pd paste was printed at pre-set positions on the upper and lower surfaces and on the lateral surfaces of the driving portion 11 and at pre-set positions on the upper and lower surfaces and on the lateral surfaces of the electrical power generating portion 12, and the resulting product was fired at a temperature of 700° C. with a keeping time of 15 minutes for forming external electrodes 114, 115, 116, 117, 120, 121, 122 and 123.

Then, using a polarization apparatus, an electrical field of 2 to 3 kV/mm was applied in a silicone oil at a temperature of 100 to 200° C. for polarizing the driving portion 11 and the electrical power generating portion 12.

An electrical voltage was applied to the resulting piezoelectric transformer with a load of 10 ohms and a driving frequency of 70 kHz and the transformer was driven with the second-order mode of resonance in the longitudinal direction for evaluating the transformer characteristics. It was found that an output voltage was 20 to 30 W, with a transformation efficiency of 98.5% and a ratio of transformation of 0.252.

Figure 5:
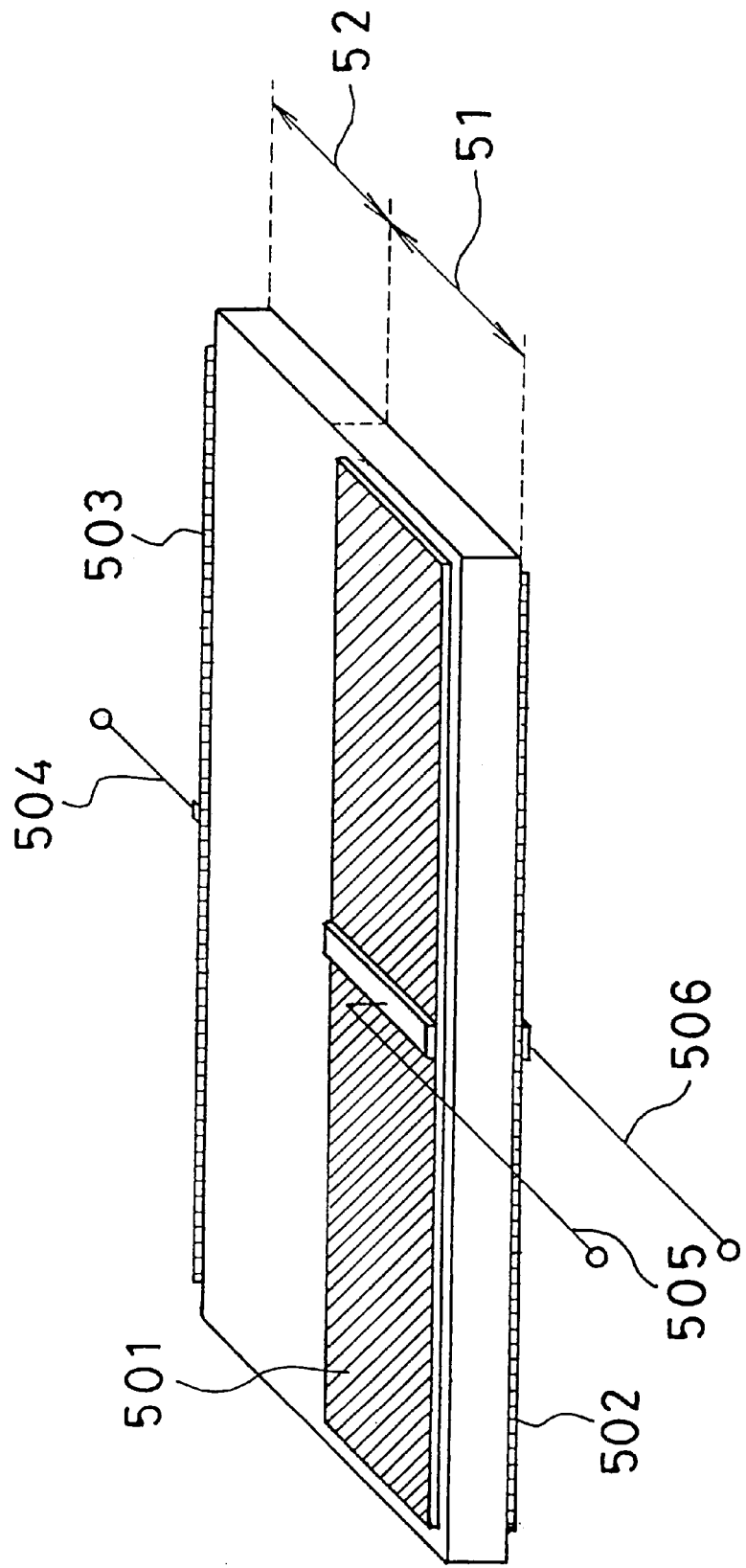
FIG. 5 is a perspective view showing a conventional step-down piezoelectric transformer.
Figure 6:
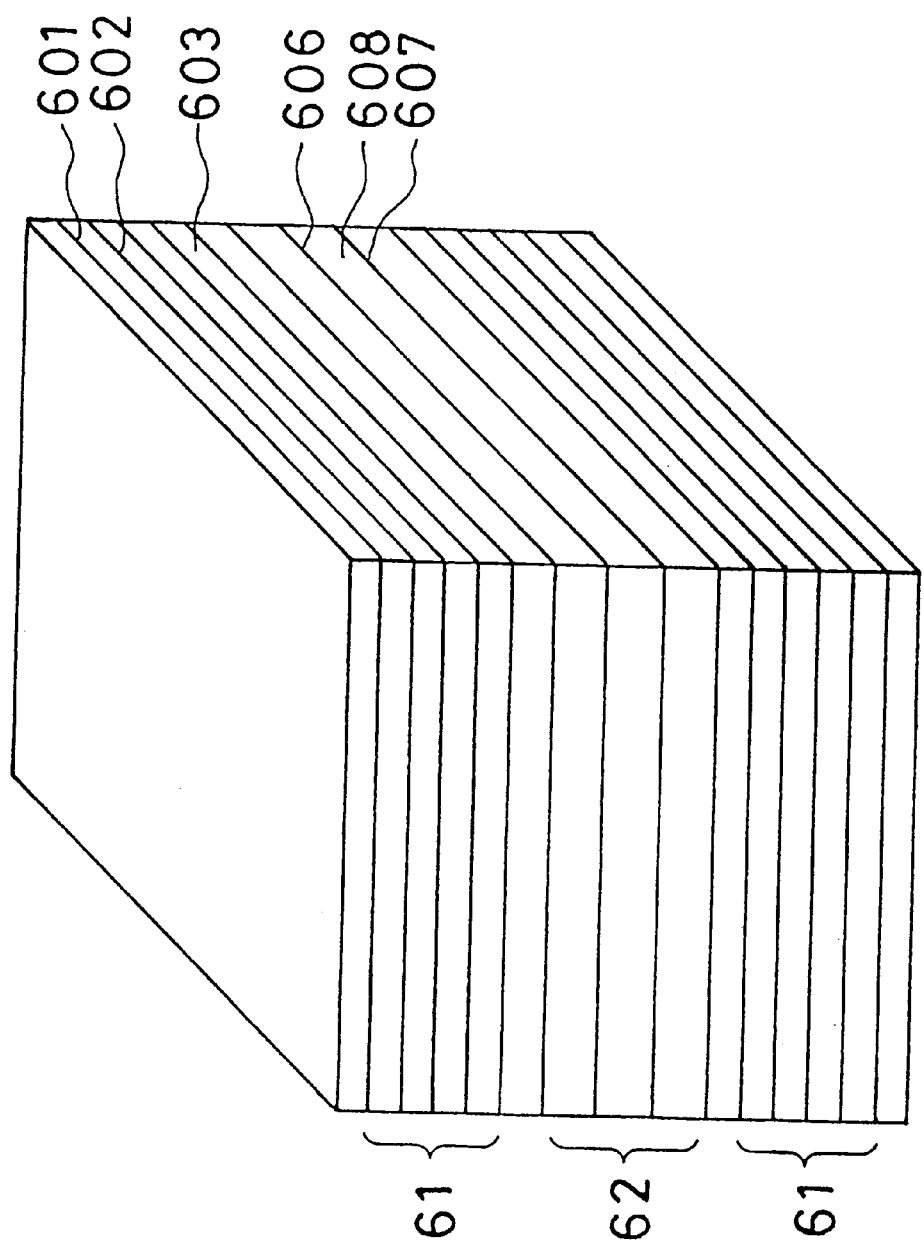
FIG. 6 is a perspective view showing a conventional step-down piezoelectric transformer.

In the prior-art example according to JP-A-6-177451 as shown in FIG. 5, the output power, the transformation efficiency and the ratio of transformation are 16 to 32 W, 91 to 95% and 0.16 to 0.15, respectively.

It is thus seen that the piezoelectric transformer of the present embodiment is superior to the conventional (prior art) transformer in transformation efficiency.

The ratio of transformation in the present embodiment can be optionally set by adjusting the laminated structure of the driving and electric power generating portions. Therefore, it is meaningless to make comparison with the conventional transformer in this respect.

A second embodiment of the present invention is hereinafter explained. The present second embodiment differs from the above first embodiment only in the laminated structure of the driving and electrical power generating portions of the piezoelectric transformer. Therefore, solely this point is now explained.

As for the laminated structure of the second embodiment of the present invention, the driving portion 11 is made up of 8 layers of the piezoelectric member layers and 7 layers of the internal electrode layers, with a thickness between the internal electrodes being 500 μm, whilst the electrical power generating portion 12 is made up of 48 layers of the piezoelectric member layers and 47 layers of the internal electrode layers, with a thickness between the internal electrodes being 83 μm.

As for the outer size of the piezoelectric transformer, the length, width and thickness were 48 mm, 15 mm and 4 mm, respectively.

An electrical voltage was applied to the resulting piezoelectric transformer with a load of 10 ohms and a driving frequency of 70 kHz and the transformer was driven with the second-order mode of resonance in the longitudinal direction for evaluating the transformer characteristics. It was found that an output voltage was 30 to 40 W, with the transformation efficiency of 98.3% and a transformation ratio of 0.167.

By varying the laminated structure of the driving and electrical power generating portions from that of the first embodiment, the ratio of transformation could be lowered, with the transformation efficiency remaining unchanged. It is confirmed based on this result that, by adjusting the laminated structure, the ratio of transformation can be adjusted, with the transformation efficiency being kept at a high value.

The effects of the invention are summarized as follows.

According to the present invention, as described above, the piezoelectric transformer can be held at a nodal point by constructing the driving and electric power generating portions by alternately layering piezoelectric members and internal electrodes, providing an insulating portion between the driving and electric power generating portions and by driving with the second-order mode of resonance in the longitudinal direction. Thus, the transformation efficiency can be set to a sufficiently high value, while the impedance matching can be realized easily by the laminated structure of the driving and electric power generating portions, and the transformation ratio can be adjusted at will.

Moreover, according to the present invention, the input and the output are isolated form each other, while there are presented no safety problems.

What is claimed is:

1. A laminated piezoelectric transformer comprising:
   a driving portion;
   an electrical power generating portion;
   an insulating portion disposed between said driving portion and said electrical power generating portion;
   said driving portion, electrical power generating portion and insulating portion being disposed longitudinally along the direction of vibration propagation; and
   wherein each said driving and electrical power generating portion is comprised of alternately laminated piezoelectric members and internal electrodes stacked in a direction substantially perpendicular to the longitudinal direction of vibration propagation; and
   wherein a single-layer thickness of the piezoelectric member of said driving portion is thicker than a single-layer thickness of said electrical power generating portion.

2. The laminated type piezoelectric transformer as defined in claim 1, wherein said driving portion and said electrical power generating portion are arranged separated from each other by a distance equal to a basic wavelength λ/2, which is equal to one half a mechanical resonance wavelength of longitudinal vibration along the length of the piezoelectric transformer in the shape of the elongated plate, and
   wherein said driving portion is driven at a doubled vibration mode of said basic wavelength λ/2.

3. The laminated piezoelectric transformer as defined in claim 2 wherein the transformer acts as a step-down transformer.

4. The laminated piezoelectric transformer as defined in claim 1, wherein the transformer acts as a step-down transformer.

5. The laminated piezoelectric transformer as defined in claim 1, wherein said insulating portion is disposed along the thickness of the transformer.

6. The laminated piezoelectric transformer as defined in claim 1, wherein the driving portion and the electrical power generating portion are dimensioned and disposed such that the transformer is driving at the second order mode of a longitudinal resonance mechanical vibration of the transformer.

7. A laminated piezoelectric transformer comprising:
   a driving portion;
   an electrical power generating portion;
   an insulating portion disposed between said driving portion and said electrical power generating portion;
   said driving portion, electrical power generating portion and insulating portion being disposed longitudinally along the direction of vibration propagation; and
   wherein each said driving and electrical power generating portion is comprised of alternately laminated piezoelectric members and internal electrodes stacked in a direction substantially perpendicular to the longitudinal direction of vibration propagation; and
   wherein a single-layer thickness of the piezoelectric member of said driving portion is different from a single-layer thickness of said electrical power generating portion.

8. The laminated type piezoelectric transformer as defined in claim 7, wherein said driving portion and said electrical power generating portion are arranged separated from each other by a distance equal to a basic wavelength λ/2 which is equal to one half a mechanical resonance wavelength of longitudinal vibration along the length of the piezoelectric transformer in the shape of the elongated plate.

9. The laminated type piezoelectric transformer as defined in claim 8, wherein said driving portion is driven at a doubled vibration mode of said basic wavelength.

10. The laminated piezoelectric transformer as defined in claim 8, wherein the transformer acts as a step-down transformer.

11. The laminated piezoelectric transformer as defined in claim 8, wherein the driving portion and the electrical power generating portion are dimensioned and disposed such that the transformer is driven at the second order mode of a longitudinal mechanical resonance vibration of the transformer.

12. The laminated piezoelectric transformer as defined in claim 7, wherein the transformer acts as a step-down transformer.

13. The laminated piezoelectric transformer as defined in claim 7, wherein the transformer acts as a step-up transformer.

* * * * *

UNITED STATES PATENT AND TRADEMARK OFFICE
CERTIFICATE OF CORRECTION

PATENT NO. : 6,008,565
DATED : December 28, 1999
INVENTOR(S) : Takayuki INOI and Takesi INOUE It is certified that error appears in the above-identified patent and that said Letters Patent is hereby corrected as shown below:

Column 4, line 39, after "oscillation" insert --mode $(2 \times (\lambda/2) = \lambda)$.

Column 8, line 67, after "wavelength" insert --$\lambda/2$--.

Signed and Sealed this

Twenty-fourth Day of April, 2001

*Attest:*

NICHOLAS P. GODICI

*Attesting Officer*   Acting Director of the United States Patent and Trademark Office